United States Patent
Stewart et al.

(10) Patent No.: US 6,266,132 B1
(45) Date of Patent: Jul. 24, 2001

(54) STEPPER WITH EXPOSURE TIME MONITOR

(75) Inventors: Edward C. Stewart, Buda; Curtis W. Doss; Richard D. Edwards, both of Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/401,586

(22) Filed: Sep. 22, 1999

(51) Int. Cl.$^7$ .................... G03B 27/72; G03B 27/54; G03B 27/74; A61N 5/00; G03C 5/00

(52) U.S. Cl. .................... 355/69; 355/35; 355/67; 355/68; 355/71; 250/492.2; 250/492.22; 430/30; 430/311; 430/312

(58) Field of Search .................... 355/67, 68, 69, 355/71, 35; 250/492.2, 492.22; 430/30, 311, 312

(56) References Cited

U.S. PATENT DOCUMENTS 5,250,797 * 10/1993 Sano et al. .................... 355/68
5,684,566 * 11/1997 Stanton .................... 355/67
5,854,671 * 12/1998 Nishi .................... 355/53
5,861,944 * 1/1999 Nishi .................... 355/68

* cited by examiner

Primary Examiner—Russell Adams
Assistant Examiner—Khaled Brown
(74) Attorney, Agent, or Firm—Williams, Morgan & Amerson, P.C.

(57) ABSTRACT

A method for detecting a degraded light source is provided. An exposure time associated with the light source is monitored. The exposure time is compared to at least one control limit. A degraded condition is identified based on the exposure time violating the control limit. A processing tool includes a stepper and an automatic process controller. The stepper has a light source and is adapted to illuminate a wafer for an exposure time. The automatic process controller is adapted to monitor the exposure time, compare the exposure time to at least one control limit, and identify a degraded condition based on the exposure time violating the control limit.

18 Claims, 2 Drawing Sheets

STEPPER WITH EXPOSURE TIME MONITOR

BACKGROUND OF THE INVENTION

1. Field of the Invention

This invention relates generally to semiconductor processing, and more particularly, to a stepper having a exposure time monitor for identifying a degraded lamp condition.

2. Description of the Related Art

Semiconductor devices, or microchips, are manufactured from wafers of a substrate material. Layers of materials are added, removed, and/or treated during fabrication to create the electrical circuits that make up the device. The fabrication essentially comprises four basic operations. The four operations are:

layering, or adding thin layers of various materials to a wafer from which a semiconductor is produced;

patterning, or removing selected portions of added layers;

doping, or placing specific amounts of dopants in the wafer surface through openings in the added layers; and heat treatment, or heating and cooling the materials to produce desired effects in the processed wafer.

Although there are only four basic operations, they can be combined in hundreds of different ways, depending upon the particular fabrication process. Indeed, whole texts have been written on the many ways in which these operations can be employed. See, e.g., Peter Van Zant, Microchip Fabrication A Practical Guide to Semiconductor Processing (3d Ed. 1997 McGraw-Hill Companies, Inc.) (ISBN 0-07-067250-4).

Patterning is also sometimes called photolithography, photomasking, masking, oxide removal, metal removal, and microlithography. The term "photolithography" will hereafter be used to refer to patterning operations. In photolithography, typically, a machine called a "stepper" positions a portion of a wafer being processed under a "reticle," or photomask. A reticle is a pattern created in a layer of chrome on a glass plate. Light is then shone onto the wafer through the reticle. The chrome blocks some of the light. The light shining through the pattern on the reticle changes the material characteristics of the wafer where it contacts the wafer. These changes make the material more or less susceptible to removal in another operation, depending on the particular process being implemented. The stepper then positions another portion of the wafer under the reticle, and the operation is repeated. This process is repeated until the entire wafer has undergone the operation.

Next, portions of the photoresist layer are removed to expose selected portions of the underlying process layer. Thereafter, typically through one or more etching processes, the exposed portions of the underlying process layer are removed to define a pattern in the underlying process layer. The purpose of photolithography is to define what will ultimately become patterns in or on a layer on a wafer, the parts of which may ultimately become parts of the semiconductor device. These patterns in the layer of photoresist must be laid down precisely in the exact dimensions, within certain manufacturing tolerances, required by the circuit design and to locate them in their proper place.

The photolithography operations generally set the "critical dimensions" of the semiconductor devices (e.g., the width of the gate conductor in an illustrative field effect transistor). Errors in the photolithography process can cause a whole host of problems including, but not limited to, distorted patterns, misplaced patterns, and other defects. These types of errors can ultimately result in undesirable changes in the functioning of the electrical circuits so that the wafer has to be scrapped. Photolithography processes are performed at very small dimensions, so that they are also highly susceptible to contamination by unwanted variations in processing conditions.

The light source, also referred to as a lamp, used in a stepper to expose a wafer degrades over time due to repeated uses. Typical control circuitry on any number of commercially available steppers automatically adjusts the exposure time of the lamp to account for the degradation. The stepper control circuitry monitors the exposure dose of light received by the wafer and maintains a constant exposure dose by increasing the exposure time accordingly. Thus, lamp degradation does not result in variations in the exposure dose received by the photoresist layer being patterned and negatively impact the photolithography process.

Certain classes of photoresist, sometimes referred to as chemically amplified resists, employ a post exposure bake process after exposure in the stepper to bring the patterning step to fruition. During the post exposure bake, hydrogen free radicals, formed in small quantities on the surface of the photoresist layer during the exposure in the stepper, diffuse through the photoresist layer and foster the chemical reactions necessary to change the solubility of the exposed portions such that either the exposed portions or the unexposed portions may be removed in a subsequent developing step.

There comes a point in the stepper exposure time automatic control process where the exposure time is increased to such a level as to cause heating affects in the photoresist layer being exposed. These heating effects may cause undesirable diffusion of the hydrogen free radicals before desired, thus altering the pattern formed in the photoresist and possibly resulting in the scrapping of the wafer being processed. A common technique for preventing the increasing exposure time from deleteriously affecting the processing of wafers involves periodically changing the lamp on a fixed interval (e.g., after a predetermined number of processing runs). Because lamps do not always degrade at the same rate, the replacement interval is typically selected using a conservative number of runs. If the replacement interval is overly conservative, equipment down time and maintenance costs negatively impact the efficiency of the stepper. If the replacement interval is too great, heating affects can damage wafers being processed, also decreasing the efficiency of the stepper.

The present invention is directed to overcoming, or at least reducing the effects of, one or more of the problems set forth above.

SUMMARY OF THE INVENTION

One aspect of the present invention is seen in a method for detecting a degraded light source. An exposure time associated with the light source is monitored. The exposure time is compared to at least one control limit. A degraded condition is identified based on the exposure time violating the control limit.

Another aspect of the present invention is seen in a processing tool including a stepper and an automatic process controller. The stepper has a light source and is adapted to illuminate a wafer for an exposure time. The automatic process controller is adapted to monitor the exposure time, compare the exposure time to at least one control limit, and identify a degraded condition based on the exposure time violating the control limit.

BRIEF DESCRIPTION OF THE DRAWINGS

The invention may be best understood by reference to the following description taken in conjunction with the accompanying drawings, in which like reference numerals identify like elements, and in which.

Figure 1:
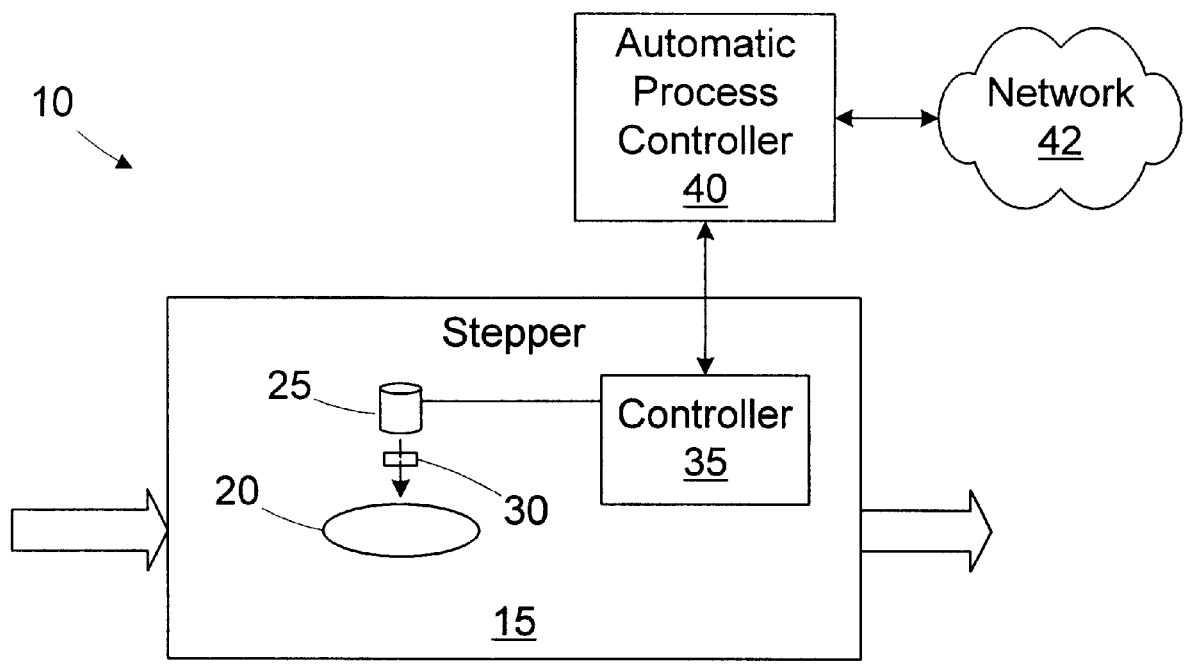
FIG. 1 is a simplified block diagram of a processing tool in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of a processing tool 10 is provided. The processing tool 10 includes a stepper 15 used in a photolithography process for exposing a wafer 20 to a light source 25. The incident radiation from the light source 25 passes through a photomask 30, reacts with a layer of photoresist on the wafer 20 to define a pattern thereon. A controller 35, among other things, monitors the exposure dose (i.e., intensity integrated over time) supplied by the light source 25 and adjusts the amount of time (i.e., exposure time) the light source exposes the photoresist on the wafer 20. An automatic process controller 40 interfaces with the controller 35 to monitor the exposure time.

The automatic process controller 40 may be implemented using dedicated hardware or, alternatively, it may be implemented on a computer (not shown) executing software instructions. The software instructions may be encoded on removable media (e.g., floppy or CD-ROM disk) or fixed media (e.g., hard disk drive, flash memory, programmable read only memory, etc.). The automatic process controller 40 may be adapted to react to various deviations in the exposure time depending on the particular nature of the light source 25.

Figure 2:
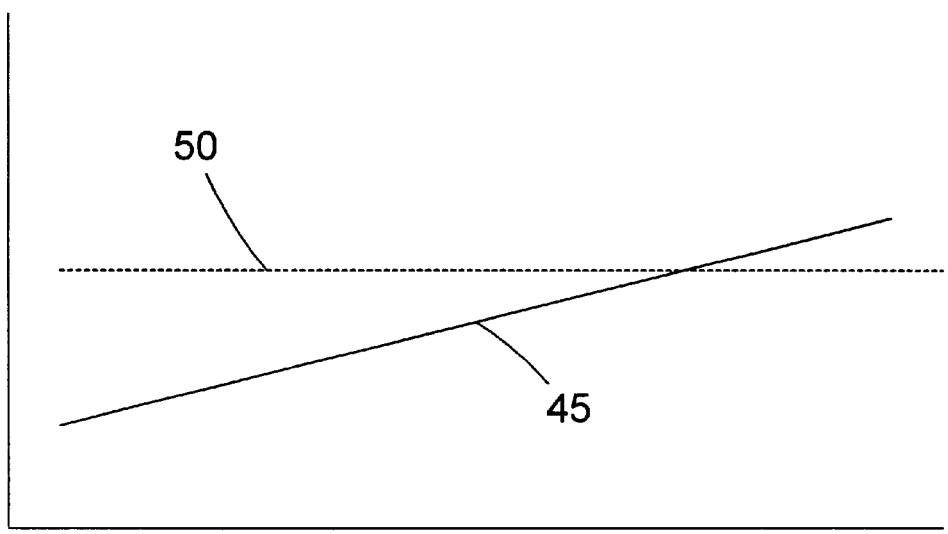
FIG. 2 is a control chart illustrating a first control technique for identifying a degraded light source used in the automatic process controller of FIG. 1.

In a first example, the light source 25 provides radiation having a wavelength of about 365 nm (i.e., referred to as I-Line), the lamp (not shown) used in the light source 25 degrades over time. As a result, the controller 35 gradually increases the exposure time to compensate. Turning now to FIG. 2, a control chart is provided to illustrate the monitoring of the light source 25 performed by the automatic process controller 40. The exposure time 45 increases as described above. If the exposure exceeds a predetermined upper control limit 50, the automatic process controller 40 signals a degraded light source condition. The particular upper control limit 50 is selected based on various factors, including, but not limited to, the particular light source 25 being used and the particular type of photoresist being exposed. In a specific example, for a 1500 W light source, available from USHIO America, Inc., and an I-Line photoresist, available from the Shipley Corporation, the upper control limit is selected as 200 milliseconds.

Figure 3:
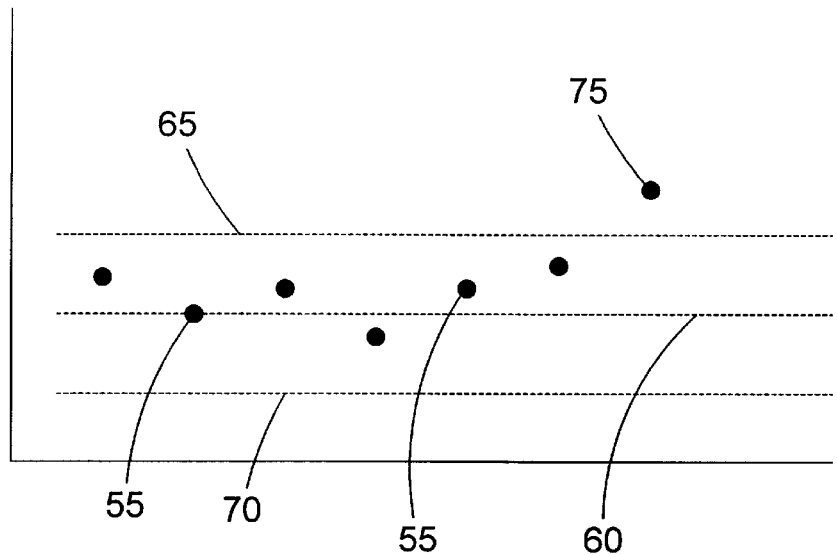
FIG. 3 is a control chart illustrating a second control technique for identifying a degraded light source used in the automatic process controller of FIG. 1.

In a second example, the light source 25 is a laser used in conjunction with a deep-UV photoresist. The light source provides radiation having a wavelength of about 248 nm. The laser (not shown) used in the light source 25 does not degrade over time, as with the I-line lamp, however, exposure deviations may indicate a degraded condition (e.g., failure of the laser, laser controls, or stepper controls). As illustrated in FIG. 3, a second control chart is provided to illustrate the monitoring of the light source 25 performed by the automatic process controller 40. The exposure times 55 vary within statistical limits about a target exposure time 60. If the exposure time exceeds either of a predetermined upper control limit 65 and a predetermined lower control limit 70, the automatic process controller 40 signals a degraded light source condition. Again, the particular control limits 65, 70 are selected based on various factors, including, but not limited to, the particular light source 25 being used and the particular type of photoresist being exposed. In a specific example, for a 10 W excimer laser, offered by Cymer, Inc., and a deep UV photoresist, available from Shipley Corporation, the upper control limit is selected as 20 milliseconds and the lower control limit is selected as 5 milliseconds.

Figure 4:
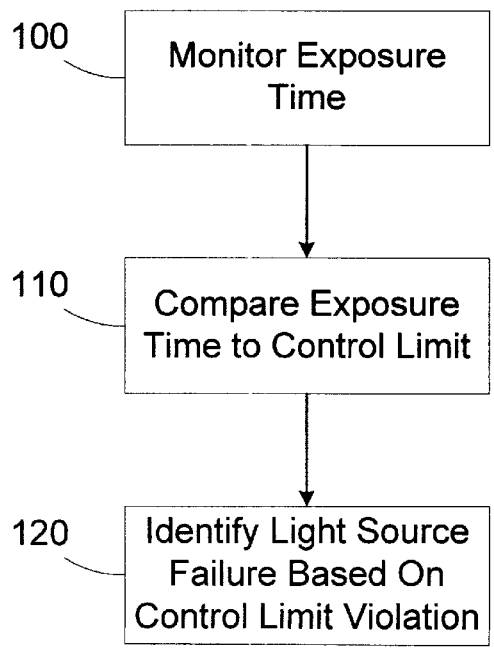
FIG. 4 is a simplified flow diagram of a method for identifying a degraded light source in accordance with the present invention.

Turning now to FIG. 4, a flow diagram of a method for identifying a degraded light source (e.g., the light source 25) is provided. In block 100, the exposure time is monitored (e.g., by the automatic process controller 40). The exposure time is compared to the predetermined control limit or limits 50, 65, 70 as described above in block 110. A control limit violation is identified in block 120. Based on the control limit violation, the light source 25 is determined to be degraded.

There are numerous actions that may be taken after the automatic process controller 40 has identified the degraded light source 25. For example, the automatic process controller 40 may trigger a local alarm or signal light and prevent further operation of the stepper 15. The automatic process controller 40 may be coupled to a centralized communication system such as a network 42 for communicating with other devices. The automatic process controller 40 may be programmed to send an e-mail message to a designated operator of the processing tool 10. The automatic process controller 40 may also send a message through the network 42 to a centralized facility management system (not shown) to identify the degraded condition.

Monitoring the light source 25 to identify degraded conditions as described above provides several advantages. For example, the replacement interval may be extended automatically for lamps that degrade at a slower rate. Also, problems with the light source 25, such as a quickly degrading lamp or a faulty laser, may be identified before defective wafers are produced.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for detecting a degraded light source, comprising:

monitoring an exposure time associated with the light source;

comparing the exposure time to at least one control limit; and identifying a degraded condition based on the exposure time violating the control limit.

2. The method of claim 1, further comprising generating a degraded light source signal in response to identifying the degraded condition.

3. The method of claim 1, wherein the light source is installed in a processing tool, and the method further comprises providing an indication of the degraded condition proximate the processing tool.

4. The method of claim 1, further comprising sending an electronic message over a network indicating the degraded condition.

5. The method of claim 1, further comprising preventing further operation of a stepper containing the light source in response to the degraded condition.

6. The method of claim 1, wherein the control limit is about at least 150 milliseconds.

7. The method of claim 1, wherein comparing the exposure time includes comparing the exposure time to an upper control limit and a lower control limit and identifying the degraded condition includes identifying the degraded condition based on the exposure time violating at least one of the upper and lower control limits.

8. The method of claim 7, wherein the upper control limit is about 20 milliseconds and the lower control limit is about 5 milliseconds.

9. A processing tool, comprising:

a stepper having a light source adapted to illuminate a wafer for an exposure time; and an automatic process controller adapted to monitor the exposure time, compare the exposure time to at least one control limit, and identify a degraded condition based on the exposure time violating the control limit.

10. The processing tool of claim 9, wherein the automatic process controller is further adapted to send a degraded light source message in response to identifying the degraded condition.

11. The processing tool of claim 10, wherein the degraded light source message includes an indication of the degraded condition proximate the processing tool.

12. The processing tool of claim 10, wherein the degraded light source message includes an electronic message over a network indicating the degraded condition.

13. The processing tool of claim 9, wherein the automatic process controller is further adapted to prevent further operation of the stepper in response to the degraded condition.

14. The processing tool of claim 9, wherein the control limit is about at least 150 milliseconds.

15. The processing tool of claim 9, wherein the automatic process controller is further adapted to compare the exposure time to an upper control limit and a lower control limit and identify the degraded condition based on the exposure time violating at least one of the upper and lower control limits.

16. The processing tool of claim 15, wherein the upper control limit is about 20 milliseconds and the lower control limit is about 5 milliseconds.

17. The processing tool of claim 9, wherein the stepper includes a controller adapted to adjust the exposure time to maintain a predetermined exposure dose provided to the wafer.

18. A processing tool, comprising:

means for illuminating a wafer for an exposure time; and means for monitoring the exposure time;

means for comparing the exposure time to at least one control limit; and means for identifying a degraded condition based on the exposure time violating the control limit.

* * * * *